(12) United States Patent
Aiba et al.

(10) Patent No.: US 6,586,273 B2
(45) Date of Patent: Jul. 1, 2003

(54) SEMICONDUCTOR DEVICE MANUFACTURING METHOD HAVING A STEP OF APPLYING A COPPER FOIL ON A SUBSTRATE AS A PART OF A WIRING CONNECTING AN ELECTRODE PAD TO A MOUNTING TERMINAL

(75) Inventors: Yoshitaka Aiba, Kawasaki (JP); Mitsutaka Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/866,660

(22) Filed: May 30, 2001

(65) Prior Publication Data

US 2002/0070440 A1 Jun. 13, 2002

(30) Foreign Application Priority Data

Dec. 12, 2000 (JP) .......................................... 2000-377684

(51) Int. Cl.⁷ .......................... H01L 21/44; H01L 21/48; H01L 21/50
(52) U.S. Cl. ....................... 438/106; 438/118; 438/121; 257/690
(58) Field of Search ................................ 438/106, 118, 438/121, 125; 257/690

(56) References Cited

U.S. PATENT DOCUMENTS

| 5,604,379 A | * | 2/1997 | Mori | 257/738 |
|---|---|---|---|---|
| 5,677,576 A | * | 10/1997 | Akagawa | 257/785 |
| 5,686,758 A | * | 11/1997 | Arai et al. | 257/693 |
| 5,933,752 A | * | 8/1999 | Yanagida | 438/613 |
| 6,022,757 A | * | 2/2000 | Andoh | 438/106 |
| 6,025,648 A | * | 2/2000 | Takahashi et al. | 257/778 |
| 6,071,755 A | * | 6/2000 | Baba et al. | 438/106 |
| 6,130,110 A | * | 10/2000 | Hashimoto | 438/106 |
| 6,159,837 A | * | 12/2000 | Yamaji et al. | 438/613 |
| 6,204,564 B1 | * | 3/2001 | Miyata et al. | 257/778 |
| 6,232,656 B1 | * | 5/2001 | Yabu et al. | 257/690 |
| 6,248,615 B1 | * | 6/2001 | Wasaki | 438/106 |
| 6,256,207 B1 | * | 7/2001 | Horiuchi et al. | 361/760 |
| 6,316,288 B1 | * | 11/2001 | Hashimoto | 438/118 |
| 6,328,844 B1 | * | 12/2001 | Watanabe et al. | 156/330 |
| 6,333,565 B1 | * | 12/2001 | Hashimoto | 257/781 |
| 6,379,999 B1 | * | 4/2002 | Tanabe | 438/113 |

FOREIGN PATENT DOCUMENTS

JP          8-340002        2/1996

* cited by examiner

*Primary Examiner*—Hoai Ho
*Assistant Examiner*—Andy Huynh
(74) *Attorney, Agent, or Firm*—Armstrong, Westerman & Hattori, LLP

(57) ABSTRACT

A method of manufacturing a semiconductor device is provided. The method comprises a wire-forming step of forming a wiring on a substrate having an electrode pad so as to connect the electrode pad to a mounting terminal. The wire-forming step includes the steps of: applying a metal foil to the substrate by providing an adhesive therebetween; patterning the metal foil into a predetermined pattern so as to form the wiring; and connecting the wiring to the electrode pad electrically.

8 Claims, 13 Drawing Sheets

SEMICONDUCTOR DEVICE MANUFACTURING METHOD HAVING A STEP OF APPLYING A COPPER FOIL ON A SUBSTRATE AS A PART OF A WIRING CONNECTING AN ELECTRODE PAD TO A MOUNTING TERMINAL

BACKGROUND OF THE INVENTION

1. Field of the Invention

The present invention generally relates to a manufacturing method of a semiconductor device and a semiconductor device and, more particularly, to a manufacturing method of a semiconductor device and a semiconductor device which device has a redistribution layer.

Recently, as a semiconductor device has been rapidly miniaturized and given a higher density, mounting terminals thereof have accordingly been narrowly pitched. Especially for a CSP (Chip Size Package), the above-mentioned narrow pitch makes a serious problem when the CSP has mounting terminals provided on electrode pads formed on the periphery of a semiconductor element, because the semiconductor element has substantially the same size as the package itself.

Due to this, mounting terminals and electrode pads are formed in an offset state so that the mounting terminals are formed in a matrix in a package. This structure requires wirings (hereinafter referred to as redistribution layers) to connect the mounting terminals and the electrode pads.

On the other hand, a semiconductor device is required to be manufactured at a low cost. Accordingly, the above-mentioned redistribution layers need to be formed at a low cost.

2. Description of the Related Art

Recently, wafer-level techniques have been applied in manufacturing a CSP-type semiconductor device, in which techniques redistribution layers are formed before dicing (separating into pieces) a wafer.

In a conventional method of forming a redistribution layer on a wafer, a resist is first formed on a wafer except on an electrode pad and a region on which the redistribution layer is to be formed. Then, a metal film is formed as a redistribution layer by sputtering or electroplating. In this process, copper (Cu) is used as a material of the redistribution layer because of good electric conduction. Additionally, a surface plating of nickel (Ni) or gold (Au) is provided on the metal film, if necessary.

After the metal film is formed, the resist is removed so as to complete forming the redistribution layer that is electrically connected to the electrode pad on the wafer. After the redistribution layer is formed, steps including a step of forming a sealing resin and a step of providing a mounting terminal are performed. Thereafter, the wafer is diced into each semiconductor device.

As described above, a conventional method of manufacturing a semiconductor device employs a sputtering method or an electroplating method to form a redistribution layer. However, using a sputtering method requires expensive manufacturing facilities so as to raise a product cost of the semiconductor device.

In using an electroplating method, a base metal film needs to be preparatorily formed as an electrode connected to a power source at a position at which the redistribution layer is to be formed, which complicates the manufacturing steps. Further, in using the electroplating method, since a metal film is deposited slowly, forming a thick redistribution layer requires a long time so as to reduce a manufacturing efficiency thereof.

SUMMARY OF THE INVENTION

It is a general object of the present invention to provide an improved and useful manufacturing method of a semiconductor device and a semiconductor device in which method and device the above-mentioned problems are eliminated.

A more specific object of the present invention is to provide a manufacturing method of a semiconductor device and a semiconductor device which device can be manufactured efficiently at a low cost.

In order to achieve the above-mentioned objects, there is provided according to one aspect of the present invention a method of manufacturing a semiconductor device, the method comprising:

a wire-forming step of forming a wiring (redistribution layer) on a substrate having an electrode pad so as to connect the electrode pad to a mounting terminal, wherein the wire-forming step includes the steps of:

applying a metal foil to the substrate by providing an adhesive therebetween;

patterning the metal foil into a predetermined pattern so as to form the wiring; and connecting the wiring to the electrode pad electrically.

According to the present invention, since the wiring connecting an electrode pad and a mounting terminal is composed of a metal foil, the wiring can be formed at a reduced cost. In other words, if the wiring is formed by electroplating or sputtering, this requires expensive manufacturing facilities so as to raise a cost of the semiconductor device manufactured by these manufacturing facilities. In addition, forming the wiring (redistribution layer) by electroplating or sputtering requires a long time so as to reduce a manufacturing efficiency thereof.

To the contrary, since techniques to manufacture the metal foil are already established, as well as techniques to apply the metal foil by using an adhesive, the wire-forming step can be performed efficiently and at a low cost.

Additionally, in the semiconductor device manufacturing method according to the present invention, the adhesive may be an elastic adhesive.

According to the present invention, since the adhesive is elastic, the adhesive can undergo an elastic deformation so as to absorb irregularities on the upper surface of the substrate. Therefore, the metal foil is guaranteed to be flat and uniform when applied thereon.

Additionally, in the semiconductor device manufacturing method according to the present invention, the step of connecting may be performed after the step of applying, and the step of applying may include removing a portion of the metal foil positioned above the electrode pad and a portion of the adhesive applied on the electrode pad.

According to the present invention, in connecting the electrode pad and the metal foil after applying the metal foil on the substrate by using the adhesive, portions of the metal foil and the adhesive opposing the electrode pad are removed therefrom. Therefore, the electrode pad and the metal foil can easily be connected electrically.

Additionally, in the semiconductor device manufacturing method according to the present invention, the step of applying may include removing the portion of the metal foil positioned above the electrode pad and the portion of the adhesive applied on the electrode pad by etching.

According to the present invention, the metal foil and the adhesive on the electrode pad can be removed by spraying an etching solution or by soaking in an etching solution. This makes the removing step simple and efficient. Additionally, the removing process by etching is more precise than a removing process by machining, and costs less than a removing process by micromachining such as an ion beam machining.

Additionally, in the semiconductor device manufacturing method according to the present invention, a step of forming a barrier metal layer on the electrode pad may be performed before the step of applying.

According to the present invention, the barrier metal layer covers the electrode pad. In removing the metal foil and the adhesive by etching, the electrode pad has a risk of being damaged by an etching solution. However, forming the barrier metal layer on the electrode pad as above prevents the etching solution from damaging the electrode pad.

Additionally, in the semiconductor device manufacturing method according to the present invention, the step of applying may include removing the portion of the metal foil positioned above the electrode pad and the portion of the adhesive applied on the electrode pad by a laser.

According to the present invention, the laser can precisely remove the portions of the metal foil and the adhesive in a short time.

Additionally, in the semiconductor device manufacturing method according to the present invention, the step of connecting may include forming a metal film by electroless plating so that the metal film connects the wiring to the electrode pad electrically.

According to the present invention, the wiring can be formed at a reduced cost because electroless plating requires manufacturing facilities of a lower cost than electroplating and sputtering. Additionally, in the electroless plating, the metal film electrically connecting the metal foil and the electrode pad can be formed simply by soaking the substrate after the step of removing the portions of the metal foil and the adhesive on the electrode pad. Therefore, the metal foil and the electrode pad can be electrically connected easily with few steps. Further, in the electroless plating, since the metal film is formed also on the adhesive exposed at the inner wall of the removed portion, the metal foil and the electrode pad can surely be connected electrically.

Additionally, in the semiconductor device manufacturing method according to the present invention, the step of connecting may include forming the metal film by electroless plating so that the metal film connects the wiring to the electrode pad electrically, and that the metal film is formed on the metal foil patterned in the step of patterning.

According to the present invention, forming the metal film on the patterned metal foil (the wiring) prevents a migration from occurring between the adjacent wirings.

Additionally, in the semiconductor device manufacturing method according to the present invention, the metal foil may be made of copper (Cu).

According to the present invention, the metal foil (the wiring) can have good electric properties because copper (Cu) has a smaller impedance. On the other hand, copper (Cu) is a substance likely to cause a migration. However, forming the metal film on the patterned copper foil (the wiring) prevents a migration from occurring between the adjacent wirings, as mentioned above, so that a signal transmission speed can be increased, and the semiconductor device can be more reliable.

Additionally, in the semiconductor device manufacturing method according to the present invention, a step of forming a connection electrode on the electrode pad may be performed before the step of applying so that the step of connecting includes a step of joining the metal foil to the connection electrode by heating so as to connect the metal foil and the connection electrode electrically.

According to the present invention, the step of removing the portions of the metal foil and the adhesive opposing the electrode pad is not required, and the electrode pad and the metal foil can be electrically connected simply by heating. This facilitates the wire-forming step.

Additionally, in the semiconductor device manufacturing method according to the present invention, a step of forming the mounting terminal on the metal foil may be performed after the step of applying.

According to the present invention, since the mounting terminal is formed as a part of the metal foil, a step of independently forming a mounting terminal is unnecessary. Therefore, with the shortened manufacturing steps, the semiconductor device can be manufactured more efficiently.

In order to achieve the above-mentioned objects, there is also provided according to another aspect of the present invention a semiconductor device comprising:

a semiconductor element having an electrode pad;

a mounting terminal to be connected to a mounting substrate; and a wiring electrically connecting the electrode pad to the mounting terminal, at least a part of the wiring being formed of a metal foil.

According to the present invention, a metal foil forms at least a part of a wiring electrically connecting an electrode pad and a mounting terminal. Since such a metal foil can be formed easily at a low cost, this directly leads to decreasing the cost of the semiconductor device.

Additionally, in the semiconductor device according to the present invention, the metal foil may be applied to the semiconductor element via an elastic adhesive applied on the semiconductor element.

According to the present invention, in mounting the semiconductor device on the mounting substrate, even though the mounting substrate and the semiconductor element undergo different amounts of thermal expansion, the adhesive can absorb stresses originating from the different amounts of thermal expansion. This prevents the mounting terminal from being damaged or separated, and thus makes the semiconductor device more reliable in mounting.

Additionally, in the semiconductor device according to the present invention, the mounting terminal may be formed as a unitary part of the metal foil.

According to the present invention, the mounting terminal and the wiring can be formed at the same time. Therefore, the semiconductor device can be manufactured more simply.

Additionally, in the semiconductor device according to the present invention, the metal foil may be a copper (Cu) foil.

According to the present invention, the metal foil (the wiring) can have good electric properties because copper (Cu) has a smaller impedance. On the other hand, copper (Cu) is a substance likely to cause a migration. However, forming the copper foil as only a part of the wiring keeps a migration from occurring between the adjacent wirings, so that a signal transmission speed can be increased, and the semiconductor device can be more reliable.

Other objects, features and advantages of the present invention will become more apparent from the following detailed description when read conjunction with the accompanying drawings.

DETAILED DESCRIPTION OF THE PREFERRED EMBODIMENTS

A description will now be given, with reference to the drawings, of embodiments according to the present invention.

FIG. 1 and FIG. 2A to FIG. 2F are illustrations for explaining a semiconductor device and a manufacturing method thereof according to a first embodiment of the present invention. First, a description will be given, with reference to FIG. 1, of a structure of a semiconductor device 10A according to the first embodiment of the present invention.

Figure 1:
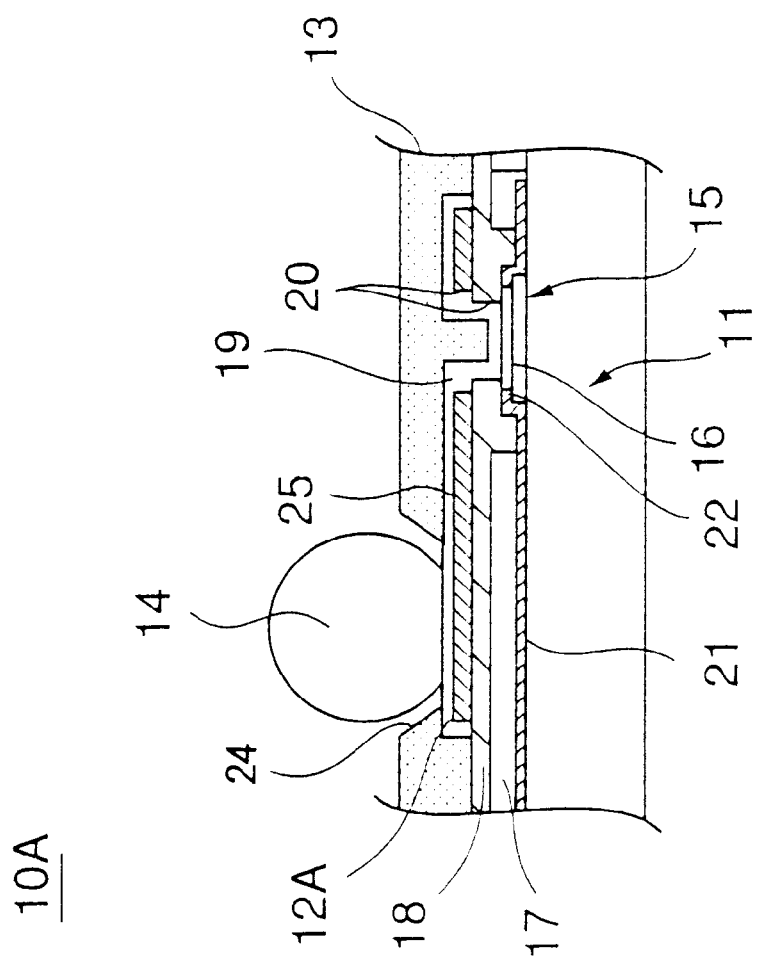
FIG. 1 is a magnified cross-sectional view of a main part of a semiconductor device according to a first embodiment of the present invention.

FIG. 1 is a magnified cross-sectional view of a main part of the semiconductor device 10A. The semiconductor device 10A according to the present embodiment is a CSP having a semiconductor element 11 and a sealing resin 13 of a substantially same size. FIG. 1 especially magnifies the vicinity of a wiring (a redistribution layer) 12A which is a main feature of the present invention.

The semiconductor device 10A mainly comprises the semiconductor element 11, the wiring 12A, the sealing resin 13, and a solder ball 14. The semiconductor element 11 has a circuit formed on the upper surface thereof in the figure, the circuit being protected by an insulating film 21. The insulating film 21 is made, for example, of a polyimide resin film.

Also on the upper surface of the semiconductor element 11 is formed an electrode pad used for an external connection. The insulating film 21 has an opening 22 formed at a position corresponding to the electrode pad 15 so that the electrode pad 15 is exposed from the insulating film 21. The electrode pad 15 is made, for example, of aluminum (Al).

Additionally, on the upper surface of the electrode pad 15 is formed a barrier metal 16 for a plating process of a metal film 19 described hereinafter, in which process the barrier metal 16 prevents the electrode pad 15 made of aluminum from being damaged, and also prevents the metal film 19 from diffusing over the electrode pad 15. The barrier metal 16 is made, for example, of nickel (Ni).

Besides, a passivation film 17 is formed on a predetermined range of the upper surface of the insulating film 21. The passivation film 17, as well as the insulating film 21, protects the semiconductor element 11, and is made of silicon dioxide ($SiO_2$).

The wiring 12A is formed above the passivation film 17 and the insulating film 21. The wiring 12A electrically connects the electrode pad 15 and the solder ball 14 that is a mounting terminal. The wiring 12A enables the solder ball 14 to be formed at a different position from the electrode pad 15. Accordingly, the solder ball 14 can be formed at various positions so as to keep a pitch between the solder balls relatively wide even when the semiconductor element 11 becomes highly dense. It is noted that, for convenience' sake, a description will be given later in detail in this specification of a structure of the wiring 12A.

The sealing resin 13 protects the semiconductor element 11 and the wiring 12A, and is formed on a wafer state before the semiconductor element 11 is cut out. Accordingly, the sealing resin 13 is severed all at once when the wafer is diced into pieces. The sealing resin 13 is formed, for example, by a compression molding method. Therefore, even when the sealing resin 13 is formed on the wafer state, a uniform resin layer can easily formed.

The sealing resin 13 has an opening 24 for a mounting terminal formed at a predetermined position opposing the wiring 12A. Thus, the wiring 12A is exposed from the opening 24 outwardly. The solder ball 14 as a mounting terminal is connected to the wiring 12A through the opening 24. It is noted that the solder ball 14 is joined to the wiring 12A, for example, by a transferring method.

Hereinafter, a description will be given of the wiring 12A.

The wiring 12A comprises a metal foil 25 and the metal film 19. In the present embodiment, a copper foil is used as the metal foil 25, because the copper foil has good electric properties. (The metal foil 25 is hereinafter referred to as a copper foil 25.) The copper foil 25 has a thickness of, for example, 5 $\mu$m, and is fixed on the passivation film 17 and the insulating film 21 by an adhesive 18. The thickness of the copper foil 25 can be easily changed according to wiring characteristics (such as a power-source wiring, a ground wiring and a signal wiring).

Generally speaking, a metal foil is widely distributed in the market, and thus, as for the copper foil 25 used in the present embodiment, the copper foil 25 having various thicknesses is widely distributed in the market. Therefore, the copper foil 25 is easily available at a low cost. Supposing that the copper foil 25 is replaced by a metal film formed by a sputtering method or a plating method, it will take a higher manufacturing cost than using the copper foil 25. Therefore, as in the present embodiment, using the copper foil 25 as a part of the wiring 12A can lower the cost of the semiconductor device 10A.

The adhesive 18 is formed substantially all over the upper surface of the semiconductor element 11 except above the electrode pad 15. Specifically, the adhesive 18 has a connection hole 20 formed at a position opposing the electrode pad 15 so that the electrode pad 15 (the barrier metal 16) is exposed from the adhesive 18. In the present embodiment, a resinous adhesive selected as having a predetermined elasticity when hardened is used as the adhesive 18.

The metal film 19 is a lamination of a nickel (Ni) film and a gold (Au) film, and thus has a high electrical conductance.

This metal film 19 is formed so as to coat the wiring 12A, and is connected to the electrode pad 15 (more specifically, connected to the electrode pad 15 via the barrier metal 16) through the connection hole 20 formed in the adhesive 18.

Thereby, the copper foil 25 and the electrode pad 15 are electrically connected to each other via the barrier metal 16 and the metal film 19. Additionally, since the solder ball 14 is formed on the wiring 12A as described above, the solder ball 14 and the electrode pad 15 are electrically connected to each other by the wiring 12A. Further, the copper foil 25, which is a material prone to be altered in qualities by oxidization and so forth, can be prevented from being altered in quality by being coated with the metal film 19. Hence, providing the metal film 19 can make the semiconductor device 10A more reliable.

Besides, it is well known that copper (Cu) is a substance likely to cause a migration. Especially when the semiconductor device 10A becomes highly dense so that a clearance between the adjacent wirings 12A becomes shorter, the influence of a migration becomes large. In the present embodiment, however, the copper foil 25 is coated with the metal film 19 so as to curb the occurrence of the migration, making the semiconductor device 10A more reliable.

By the way, when the semiconductor device 10A having the above-mentioned structure is mounted on a mounting substrate (not shown in the figures), a heating process is performed to join the solder ball 14 to the mounting substrate. In this process, if the mounting substrate and the semiconductor element 11 undergo different amounts of thermal expansion, stresses due to the different amounts of thermal expansion occur at the joint of the solder ball 14 and the wiring 12A and at the joint of the solder ball 14 and the mounting substrate, at which joints the solder ball 14 has a risk of being separated or damaged.

However, in the present embodiment, the adhesive 18 located between the semiconductor element 11 and the solder ball 14 has a predetermined elasticity even after being hardened (i.e., after the bonding of the copper foil 25). Therefore, even though the mounting substrate and the semiconductor element 11 undergo different amounts of thermal expansion as mentioned above, the adhesive 18 can undergo an elastic deformation so as to absorb the above-mentioned different amounts of thermal expansion. This prevents the solder ball 14 from being separated or damaged, and thus makes the semiconductor device 10A more reliable.

Next, a description will be given, with reference to FIG. 2A to FIG. 2F, of a manufacturing method of the semiconductor device 10A.

It is noted here that the manufacturing method according to the present embodiment is characterized especially by a wire-forming step of forming the wiring 12A, and that other manufacturing steps are well known (including a step of forming the sealing resin 13, a step of providing the solder ball 14, and a step of dicing a wafer into each semiconductor device 10A). Therefore, the following description will be made mainly of the wire-forming step of forming the wiring 12A.

The wire-forming step is a wafer-level process conducted before dicing a wafer. However, for convenience' sake in showing in the figures and in describing, FIG. 2A to FIG. 2F magnify the vicinity of the electrode pad 15 in an area where one of the semiconductor elements 11 is formed in the wafer.

Figure 2A:
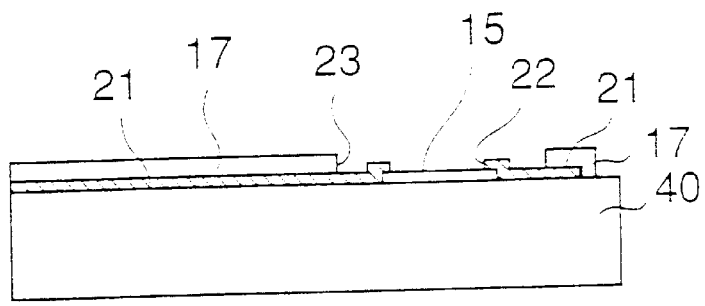
FIG. 2A is a first illustration for explaining a manufacturing method of the semiconductor device according to the first embodiment of the present invention.
Figure 2B:
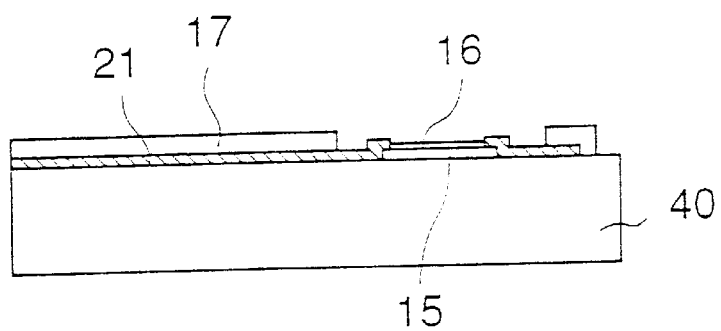
FIG. 2B is a second illustration for explaining the manufacturing method of the semiconductor device according to the first embodiment of the present invention.
Figure 2C:
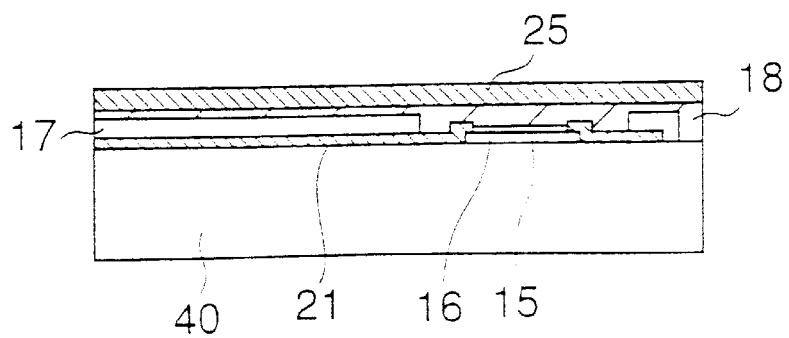
FIG. 2C is a third illustration for explaining the manufacturing method of the semiconductor device according to the first embodiment of the present invention.
Figure 2D:
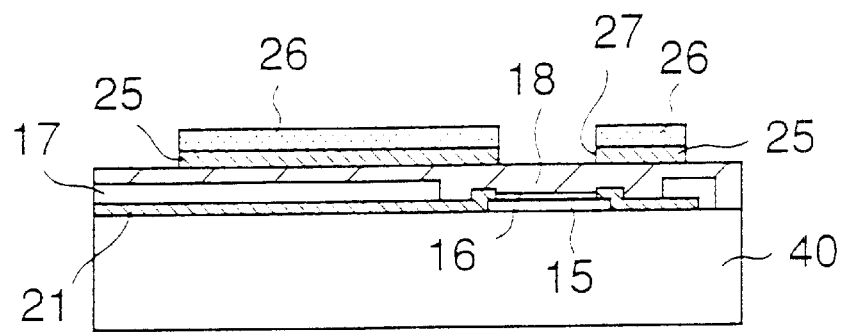
FIG. 2D is a fourth illustration for explaining the manufacturing method of the semiconductor device according to the first embodiment of the present invention.
Figure 2E:
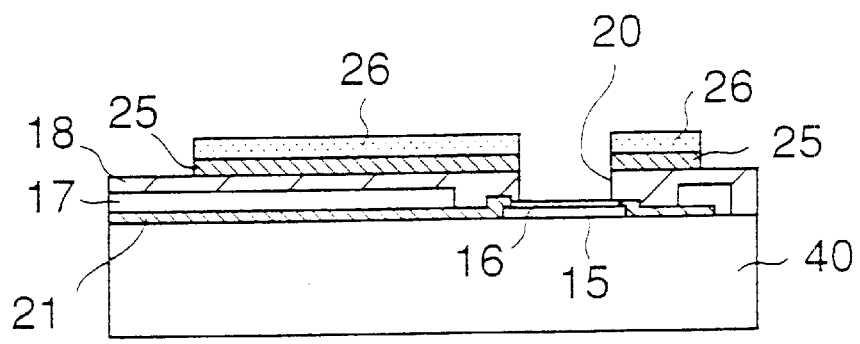
FIG. 2E is a fifth illustration for explaining the manufacturing method of the semiconductor device according to the first embodiment of the present invention.
Figure 2F:
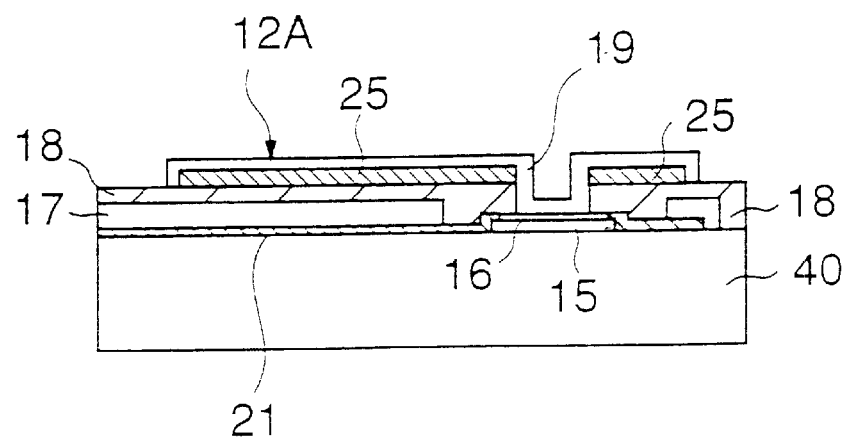
FIG. 2F is a sixth illustration for explaining the manufacturing method of the semiconductor device according to the first embodiment of the present invention.
Figure 3A:
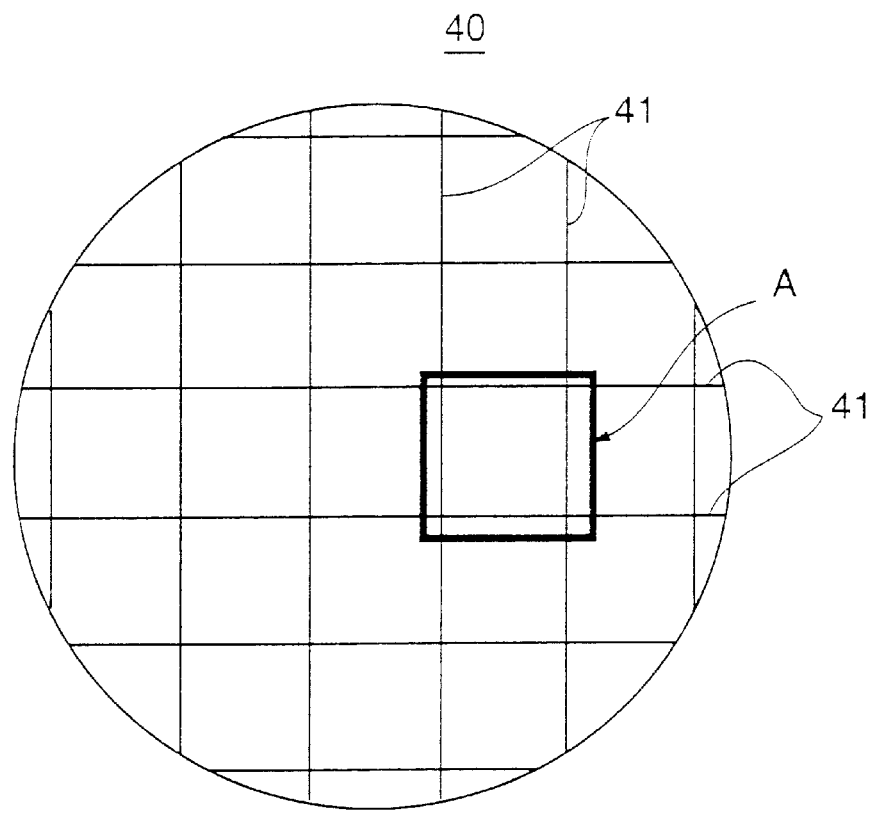
FIG. 3A is a plan view of a wafer undergoing the manufacturing method of the semiconductor device according to the first embodiment of the present invention.
Figure 3B:
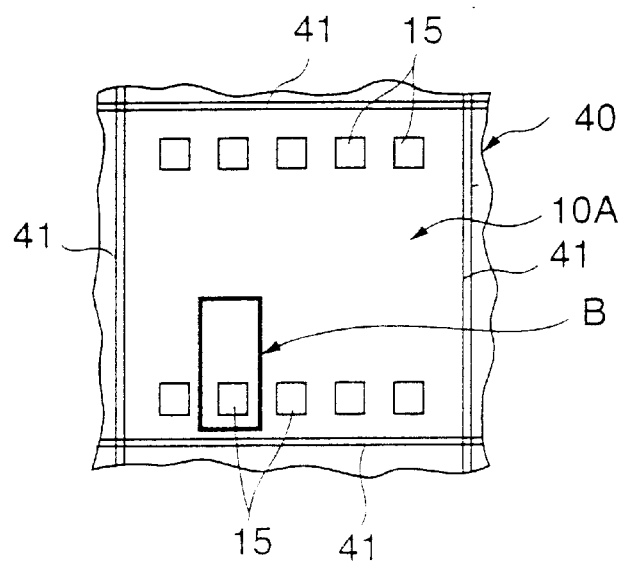
FIG. 3B is a magnification of a portion pointed by an arrow A shown in FIG. 3A.

Specifically, in a wafer 40 shown in FIG. 3A, a portion defined by a square of solid lines (a portion pointed by an arrow A) is an area where one of the semiconductor elements 11 is formed. FIG. 3B is a magnification of the portion pointed by the arrow A. FIG. 2A to FIG. 2F are cross-sectional views magnifying a portion in the vicinity of the electrode pad 15 in FIG. 3B (i.e., a portion defined by a square of solid lines pointed by an arrow B). additionally, FIG. 3A and FIG. 3B show dicing lines 41.

Prior to the wire-forming step, the wafer 40 already has a circuit formed on the upper surface thereof (a surface on which the wiring 12A is to be formed), and also has the insulating film 21 formed over the circuit so as to protect the circuit. As described above, the insulating film 21 has the opening 22 formed at the position corresponding to the electrode pad 15 so that the electrode pad 15 is exposed from the insulating film 21.

Firstly in the wire-forming step, as shown in FIG. 2A, the passivation film 17 is formed on the wafer 40 in the above-mentioned state. The passivation film 17 is conventionally formed so as to increase a mechanical strength of the wafer 40 (the semiconductor element 11). The passivation film 17 is formed on a range excluding an area where the electrode pad 15 is formed.

After the passivation film 17 is formed, the barrier metal 16 is formed on the upper surface of the electrode pad 15, as shown in FIG. 2B. The barrier metal 16 is made, for example, of nickel (Ni).

After the barrier metal 16 is formed, the adhesive 18 is applied all over the upper surface of the wafer 40. A material having a predetermined elasticity is selected as the adhesive 18. The adhesive 18 is applied on the wafer 40 by using a spin coater, for example. Therefore, even when the upper surface of the wafer 40 has irregularities, the upper surface of the adhesive 18 becomes substantially flat when applied thereon.

After the adhesive 18 is applied, the copper foil 25 is applied on the adhesive 18. Here, the copper foil 25 has a size equal to or a little larger than the wafer 40. Accordingly, the copper foil 25 is applied so as to cover the whole surface of the wafer 40.

Additionally, since the upper surface of the adhesive 18 is substantially flat as mentioned above, the upper surface of the copper foil 25 also becomes flat and uniform.

Besides, since the copper foil 25 is applied on the adhesive 18 as mentioned above, the copper foil 25 can have varieties. Specifically, a thickness of the copper foil 25 can be easily changed, and a metal foil other than the copper foil can be easily substituted for the copper foil 25. This enables the wiring 12A to be formed easily according to properties of the semiconductor device 10A (including an operability at high frequencies) and wiring characteristics of the semiconductor device 10A (such as a power-source wiring, a ground wiring and a signal wiring).

After the copper foil 25 is applied on the adhesive 18, the adhesive 18 is hardened by heating so as to fix the copper foil 25 on the wafer 40. FIG. 2C shows that the copper foil 25 is fixed on the wafer 40 by the adhesive 18.

The adhesive 18 is selectively made of a material having a predetermined elasticity even after being hardened. Therefore, as descried above, when the semiconductor device 10A is manufactured and mounted on a mounting substrate, even though the mounting substrate and the semiconductor element 11 undergo different amounts of thermal expansion, the adhesive 18 can absorb stresses originating from the different amounts of thermal expansion. This makes the semiconductor device 10A more reliable in mounting.

After the copper foil 25 is fixed on the wafer 40, a resist 26 is provided on the copper foil 25. The resist 26 is provided on a region corresponding to a predetermined position at which the wiring 12A is to be formed. The copper foil 25 is etched by using the resist 26 as a mask. Thereby, the copper foil 25 is removed except the region on which the resist 26 is provided, and is patterned into a predetermined wiring pattern of the wiring 12A. The adhesive 18 is exposed at an area where the copper foil 25 is removed.

In this etching process, a portion of the copper foil 25 opposing the electrode pad 15 is removed so as to form an opening pattern 27, as shown in FIG. 2D. Consequently, the connection hole 20 is to be formed at the position opposing the electrode pad 15 (the position corresponding to the opening pattern 27) at the end of the etching of the adhesive 18 described in the following.

After the copper foil 25 is etched, the adhesive 18 is etched. The adhesive 18 is etched chemically by using an agent (an etching solution) removing the adhesive 18 exclusively.

Additionally, the adhesive 18 is etched by using the patterned copper foil 25 and the resist 26 as a mask. The connection hole 20 is formed by this etching process so that the electrode pad 15 coated with the barrier metal 16 is exposed outwardly through the connection hole 20, as shown in FIG. 2E.

As described above, by using an etching method, the copper foil 25 and the adhesive 18 on the electrode pad 15 can be removed by spraying an etching solution or by soaking in an etching solution. This makes the removing process simple and efficient. Additionally, the removing process by using the etching method costs less than a removing process by machining or by micromachining such as an ion beam machining.

It is noted that, in this etching process, the etching solution reaches the electrode pad 15. However, as described above, the barrier metal 16 protects the electrode pad 15 so as to prevent the electrode pad 15 from being damaged.

After the connection hole 20 is formed in the adhesive 18 by etching as mentioned above, the metal film 19 is formed. The metal film 19 is formed by using an electroless plating method. As describe above, the metal film 19 is a lamination of a nickel (Ni) film and a gold (Au) film. Both of the nickel (Ni) film and the gold (Au) film are formed by the electroless plating method.

The electroless plating method involves a less equipment cost than an electroplating method or a sputtering method. This reduces a manufacturing cost of the metal film 19. Additionally, in the electroless plating method, the metal film 19 can be formed simply by soaking the wafer 40 having the copper foil 25 and the adhesive 18 removed from the electrode pad 15. Therefore, the metal film 19 can be formed easily by fewer processes. Further, the electroless plating method can plate the adhesive 18 made of a resinous material.

The metal film 19 is formed by the electroless plating method, as above, so that the patterned copper foil 25 is coated with the metal film 19, and the metal film 19 is surely formed on the inner wall of the connection hole 20 (including the adhesive 18 made of a resin) and on the electrode pad 15 (the barrier metal 16). Accordingly, the electrode pad 15 and the copper foil 25 are electrically connected by the metal film 19, forming the wiring 12A.

As described above, in the present embodiment, since the copper foil 25 forms a part of the wiring 12A, the cost required to form the wiring 12A can be reduced. That is, forming the metal film 19 by an electroplating method or a sputtering method requires expensive manufacturing facilities so as to raise the manufacturing cost of the semiconductor device 10A. In addition, forming the metal film 19 by the electroplating method or the sputtering method requires a long time so as to reduce a manufacturing efficiency thereof.

To the contrary, techniques to manufacture the copper foil 25 are already established, as well as the technique to apply the copper foil 25 by using the adhesive 18. Therefore, by forming a part of the wiring 12A by the copper foil 25, the wire-forming step of the wiring 12A can be performed efficiently and at a low cost.

Figure 4:
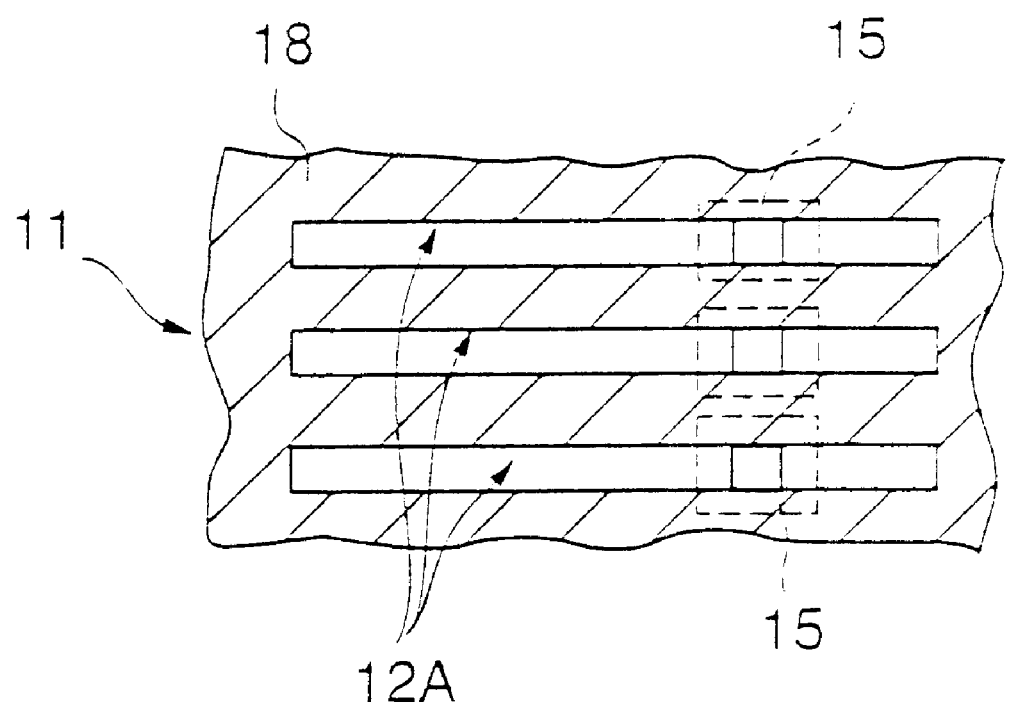
FIG. 4 is a plan view of wirings formed on a semiconductor element shown in FIG. 1.

Further, in the present embodiment, the metal film 19 is formed over the patterned copper foil 25 so as to prevent a migration from occurring between the adjacent wirings 12A. Specifically speaking, copper (Cu) forming the copper foil 25 is a substance likely to cause a migration, as is well known. Moreover, as the semiconductor device 10A becomes highly dense so that a clearance between the adjacent wirings 12A becomes shorter as seen from above in FIG. 4, the influence of the migration becomes large. In the present embodiment, however, the copper foil 25 is coated with the metal film 19 so as to curb the occurrence of the migration, allowing a signal transmission speed to be increased, and making the semiconductor device 10A more reliable.

Next, a description will be given of a manufacturing method of a semiconductor device according to a second embodiment of the present invention.

FIG. 5A to FIG. 5F are illustrations for explaining the manufacturing method of the semiconductor device according to the second embodiment of the present invention. It is noted that the semiconductor device manufactured by the manufacturing method according to the present embodiment differs from the semiconductor device 10A according to the first embodiment only in that the barrier metal 16 is not formed, and hence the semiconductor device manufactured by the manufacturing method according to the present embodiment is not shown in the figures.

It is also noted that elements in FIG. 5A to FIG. 5F that are identical to the elements shown in FIG. 1 to FIG. 3B are referenced by the same reference marks, and will not be described in detail. In addition, the description of the manufacturing method according to the present embodiment will also be made mainly of a wire-forming step of forming a wiring 12B.

The manufacturing method according to the present embodiment conducts largely the same processes as the manufacturing method according to the first embodiment. However, whereas the manufacturing method according to the first embodiment employs an etching method to form the connection hole 20 in the adhesive 18, the manufacturing method according to the present embodiment uses a laser beam machining to form the connection hole 20 in the adhesive 18.

Figure 5A:
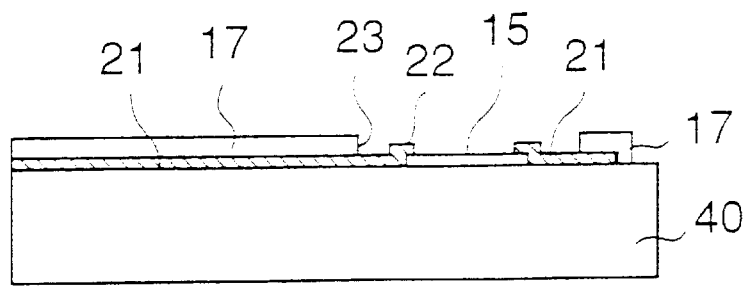
FIG. 5A is a first illustration for explaining a manufacturing method of a semiconductor device according to a second embodiment of the present invention.
Figure 5B:
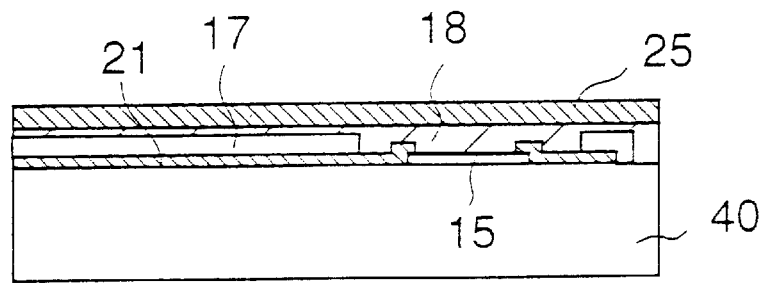
FIG. 5B is a second illustration for explaining the manufacturing method of the semiconductor device according to the second embodiment of the present invention.
Figure 5C:
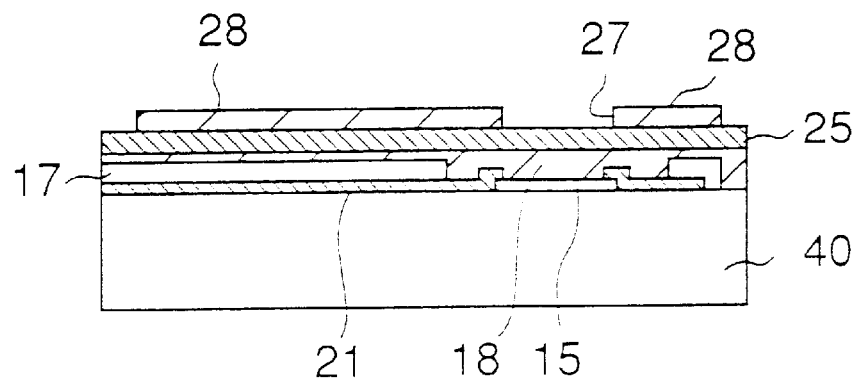
FIG. 5C is a third illustration for explaining the manufacturing method of the semiconductor device according to the second embodiment of the present invention.
Figure 5D:
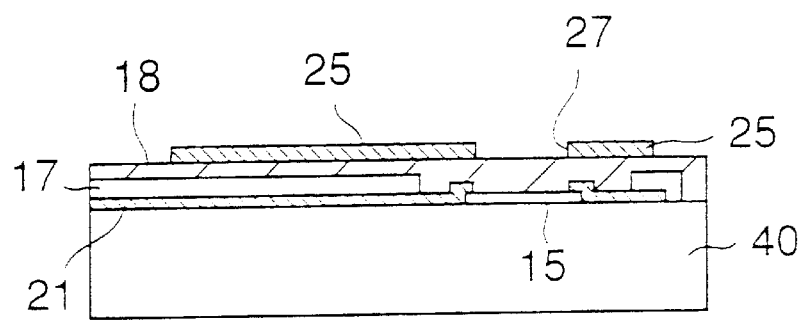
FIG. 5D is a fourth illustration for explaining the manufacturing method of the semiconductor device according to the second embodiment of the present invention.

Specifically, the processes shown in FIG. 5A to FIG. 5D are the same as the processes shown in FIG. 2A to FIG. 2D. That is, first, the passivation film 17 is formed on the wafer 40, as shown in FIG. 5A. Then, as shown in FIG. 5B, the adhesive 18 and the copper foil 25 are applied. Subsequently, as shown in FIG. 5C, a resist 28 is provided, and then the copper foil 25 is patterned by etching, as shown in FIG. 5D. In this process, the opening pattern 27 is formed at a position of the copper foil 25 opposing the electrode pad 15, as in the process shown in FIG. 2D.

In the manufacturing method according to the first embodiment, the adhesive 18 is removed, after the patterning of the copper foil 25, by an etching method while the resist 26 remains on the copper foil 25. On the contrary, in the present embodiment, the resist 28 is removed so as to expose the copper foil 25 before the adhesive 18 is removed by projecting a laser beam.

Figure 5E:
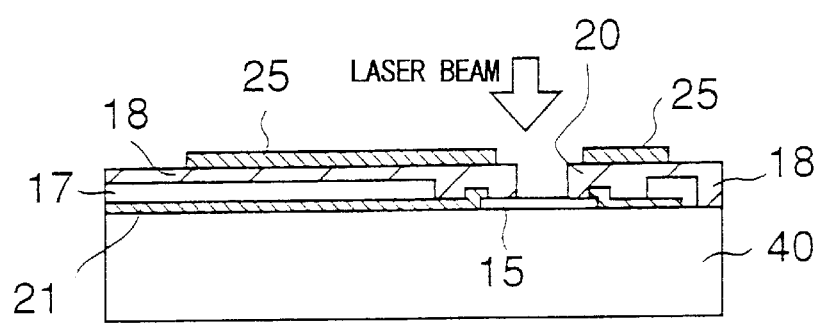
FIG. 5E is a fifth illustration for explaining the manufacturing method of the semiconductor device according to the second embodiment of the present invention.

This laser beam projection is conducted by using the copper foil 25 having the opening pattern 27 as a mask. In this way, according to the present embodiment, the adhesive 18 is removed by a laser so as to form the connection hole 20 with a high precision as well as to perform the removing process in a short time. Consequently, the connection hole 20 is formed by the laser beam machining so as to expose the electrode pad 15 through the connection hole 20, as shown in FIG. 5E.

Figure 5F:
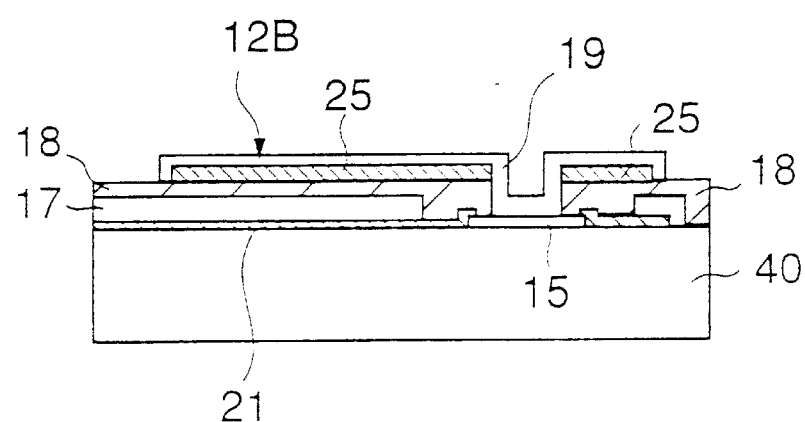
FIG. 5F is a sixth illustration for explaining the manufacturing method of the semiconductor device according to the second embodiment of the present invention.

After the connection hole 20 is formed in the adhesive 18, the metal film 19 is formed by using an electroless plating method, as in the first embodiment. Thereby, the patterned copper foil 25 is coated with the metal film 19, and the metal film 19 is surely formed on the inner wall of the connection hole 20 and on the electrode pad 15. Accordingly, as shown in FIG. 5F, the electrode pad 15 and the copper foil 25 are electrically connected by the metal film 19, forming the wiring 12B.

As described above, in the present embodiment, the connection hole 20 is formed in the adhesive 18 by a laser beam machining. Therefore, even when the connection hole 20 has a smaller diameter as a larger number of the electrode pads 15 are formed in the semiconductor element 11, the connection hole 20 can surely be formed. Hence, the present embodiment can be applicable to semiconductor devices that are increasingly becoming highly dense.

Next, a description will be given of a semiconductor device and a manufacturing method thereof according to a third embodiment of the present invention.

Figure 6:
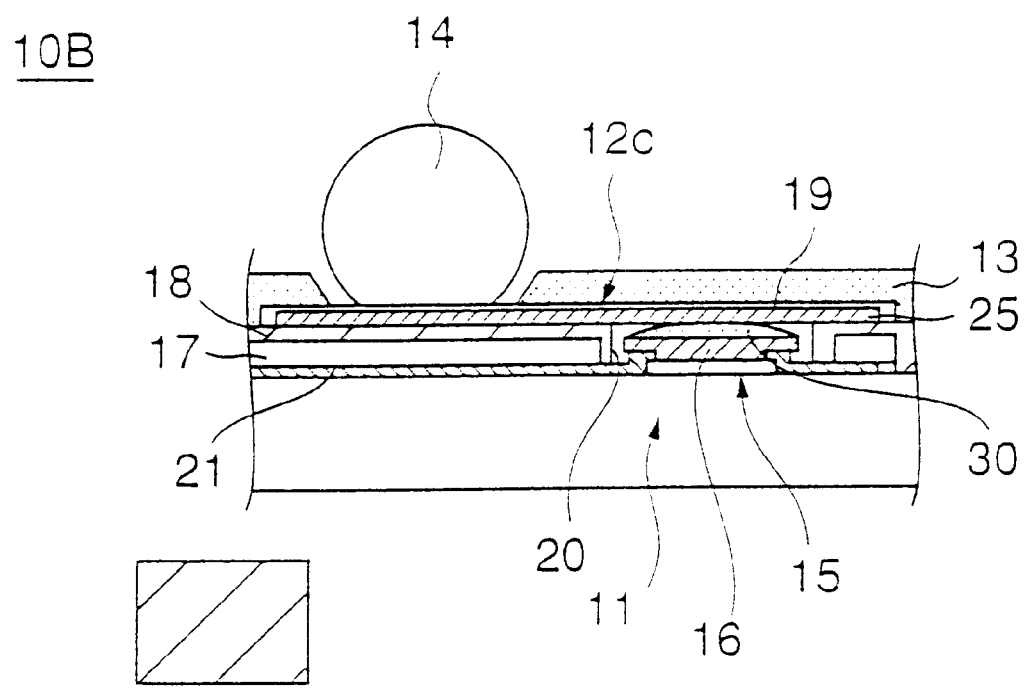
FIG. 6 is a magnified cross-sectional view of a main part of a semiconductor device according to a third embodiment of the present invention.

FIG. 6 is a magnified cross-sectional view of a main part of a semiconductor device 10B according to the third embodiment of the present invention. FIG. 7A to FIG. 7F are illustrations for explaining a manufacturing method of the semiconductor device 10B. It is noted that elements in FIG. 6 and FIG. 7A to FIG. 7F that are identical to the elements shown in FIG. 1 to FIG. 3B are referenced by the same reference marks, and will not be described in detail. In addition, the description of the manufacturing method according to the present embodiment will also be made mainly of a wire-forming step of forming a wiring 12C.

The semiconductor device 10B according to the present embodiment is characterized by using a solder bump (a connection electrode) 30 to connect the copper foil 25 and the electrode pad 15 electrically. The solder bump 30 is formed on the electrode pad 15 via the barrier metal 16. The barrier metal 16 is provided so as to prevent the solder bump 30 from diffusing over the electrode pad 15 made of aluminum.

In addition, in the present embodiment, the opening pattern 27 is not formed at the position of the copper foil 25 opposing the electrode pad 15, and thus the connection hole 20 is closed by the copper foil 25. The solder bump 30 is soldered to the undersurface of the copper foil 25 so as to be electrically connected thereto.

Accordingly, the electrode pad 15 is electrically connected via the barrier metal 16 and the solder bump 30 to the copper foil 25 forming a part of the wiring 12C. Additionally, the metal film 19 is formed over the copper foil 25 by an electroless plating method, as in the first and second embodiments, so as to prevent the copper foil 25 from being deteriorated and to curb the occurrence of a migration. It is noted here that, in the present embodiment, the metal film 19 can be formed by an electroplating method.

Next, a description will be given, with reference to FIG. 7A to FIG. 7F, of the manufacturing method of the semiconductor device 10B according to the third embodiment of the present invention.

It is noted here that the manufacturing method according to the present embodiment is also characterized especially by a wire-forming step of forming the wiring 12C, and that other manufacturing steps are well known (including a step of forming the sealing resin 13, a step of providing the solder ball 14, and a step of dicing a wafer into each semiconductor device 10A). Therefore, the following description will be made mainly of the wire-forming step of forming the wiring 12C.

Figure 7A:
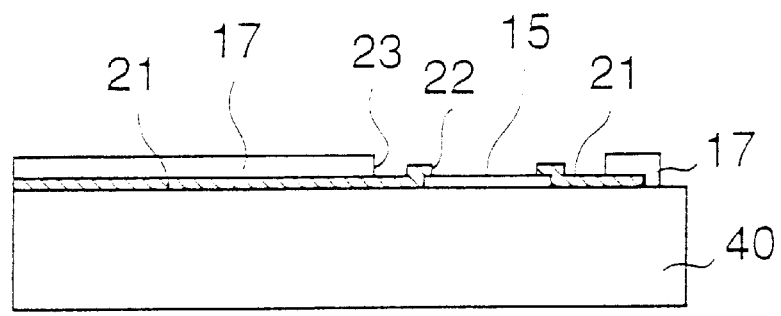
FIG. 7A is a first illustration for explaining a manufacturing method of the semiconductor device according to the third embodiment of the present invention.

In the wire-forming step according to the present embodiment, the passivation film 17 is formed on the wafer 40, as shown in FIG. 7A, followed by a process applying the adhesive 18. In the foregoing first and second embodiments, the adhesive 18 is applied all over the wafer 40. However, in the present embodiment, the adhesive 18 is applied on the wafer 40 except around the electrode pad 15. For this reason, the adhesive 18 is formed by using a screen-printing method in the present embodiment.

Figure 7B:
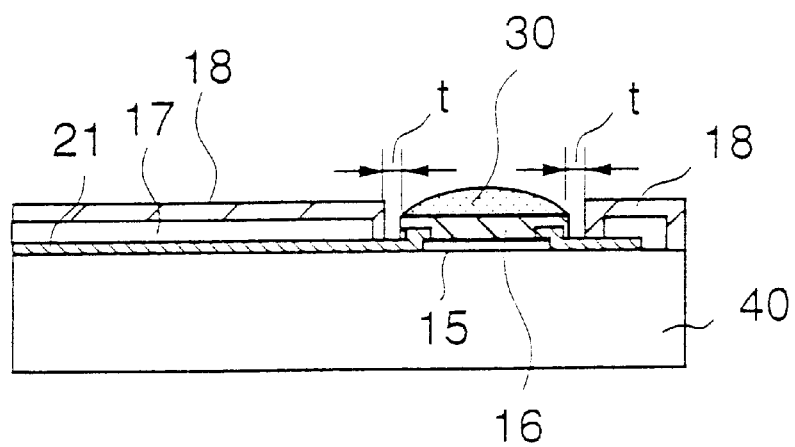
FIG. 7B is a second illustration for explaining the manufacturing method of the semiconductor device according to the third embodiment of the present invention.

Specifically, a mask (not shown in the figures) masking a portion corresponding to the position of the electrode pad 15 is arranged on the wafer 40, and then a squeegee (not shown in the figures) is used to apply the adhesive 18. Thereby, the adhesive 18 is applied on the wafer 40 except around the electrode pad 15, as shown in FIG. 7B. In this process, the adhesive 18 is applied on the inner surface of an opening 23 formed in the passivation film 17 so that an interval of at least 10 $\mu$m (an interval t in FIG. 7B) is formed between the electrode pad 15 and the adhesive 18.

After the adhesive 18 is formed as described above, the barrier metal 16 is formed on the electrode pad 15. Nickel (Ni), for example, can be used as the barrier metal 16, as in the first embodiment. After the barrier metal 16 is formed on the electrode pad 15, the solder bump 30 is formed on the barrier metal 16. The solder bump 30 is formed by using such a well-known method as a printing method or a transferring method. In this process, the solder bump 30 is formed so as to be substantially as high as or a little higher than the upper surface of the adhesive 18. FIG. 7B shows the wafer 40 having the solder bump 30 formed thereon.

After the solder bump 30 is formed, the copper foil 25 is applied on the adhesive 18 and the solder bump 30. The copper foil 25 has the same shape as or a little larger shape than the wafer 40. Accordingly, the copper foil 25 covers all over the wafer 40. Since the solder bump 30 is formed substantially as high as or a little higher than the upper surface of the adhesive 18, as mentioned above, the copper foil 25 and the solder bump 30 contact each other when the copper foil 25 is applied.

Figure 7C:
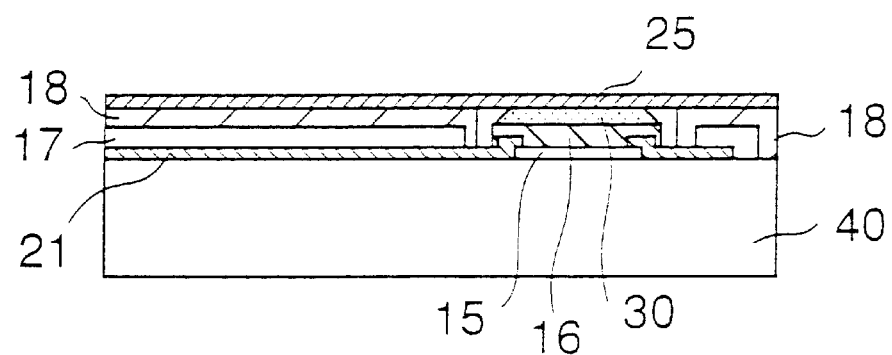
FIG. 7C is a third illustration for explaining the manufacturing method of the semiconductor device according to the third embodiment of the present invention.

After the copper foil 25 is applied on the adhesive 18 and the solder bump 30, the wafer 40 is put into a reflow furnace so as to be heated. By this heating process (a reflow process), the solder bump 30 is melted, and is soldered to the copper foil 25. Simultaneously, the adhesive 18 is also heated, and is hardened. Thereby, the copper foil 25 is electrically connected to the electrode pad 15 via the solder bump 30 and the barrier metal 16. Also, the copper foil 25 is fixed to the wafer 40 by the adhesive 18. FIG. 7C shows that the bump 30 is soldered to the copper foil 25, and that the copper foil 25 is fixed to the wafer 40 by the adhesive 18.

Figure 7D:
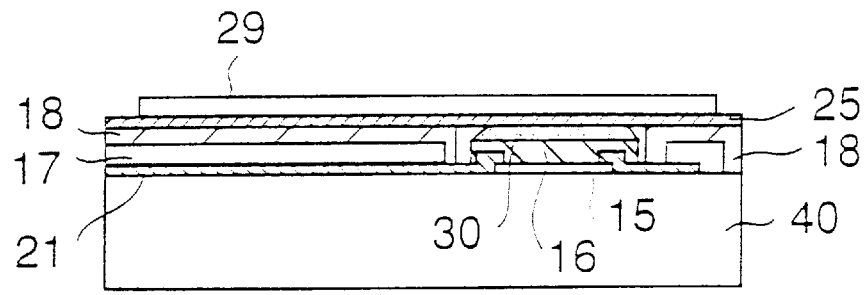
FIG. 7D is a fourth illustration for explaining the manufacturing method of the semiconductor device according to the third embodiment of the present invention.

After the copper foil 25 is fixed to the wafer 40, a resist 29 is provided on the copper foil 25, as shown in FIG. 7D. The resist 29 is provided on a region corresponding to a predetermined position at which the wiring 12C is to be formed. Then, the copper foil 25 is etched by using the resist 29 as a mask.

Figure 7E:
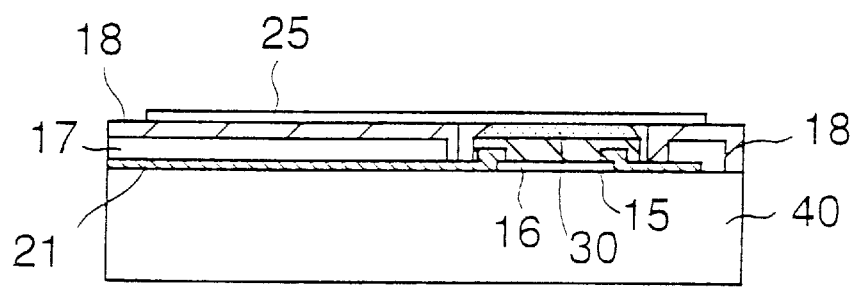
FIG. 7E is a fifth illustration for explaining the manufacturing method of the semiconductor device according to the third embodiment of the present invention.

In this etching process, the copper foil 25 is removed except a portion covered by the resist 29, and is patterned to a predetermined wiring pattern of the wiring 12C, as shown in FIG. 7E. The adhesive 18 is exposed at an area from which the copper foil 25 is removed by etching. It is noted that, in the present embodiment, the etching process does not remove a portion of the copper foil 25 opposing the electrode pad 15, because the portion of the copper foil 25 is connected to the solder bump 30.

Figure 7F:
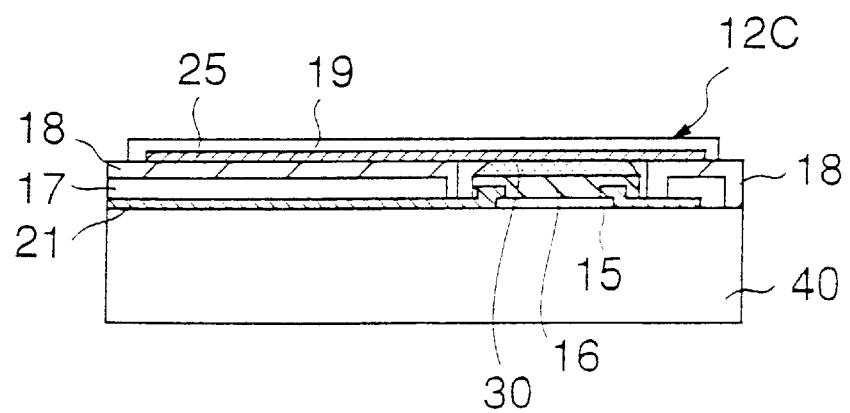
FIG. 7F is a sixth illustration for explaining the manufacturing method of the semiconductor device according to the third embodiment of the present invention.

After the copper foil 25 is patterned, the metal film 19 is formed. The metal film 19 is formed on the copper foil 25 by an electroless plating method, as in the first and second embodiments. Thereby, the patterned copper foil 25 is coated with the metal film 19, forming the wiring 12C as shown in FIG. 7F.

As described above, in the present embodiment, forming the wiring 12C does not require the removal of the portion of the copper foil 25 opposing the electrode pad 15, whereas the removal is required in the first and second embodiments. Additionally, the solder bump 30 and the copper foil 25 are electrically connected to each other simply by heating, and this heating process and the hardening of the adhesive 18 can be performed at the same time. Therefore, the manufacturing method of the semiconductor device 10B according to the present embodiment facilitates the wire-forming step of the wiring 12C.

Next, a description will be given of a semiconductor device and a manufacturing method thereof according to a fourth embodiment of the present invention.

Figure 8:
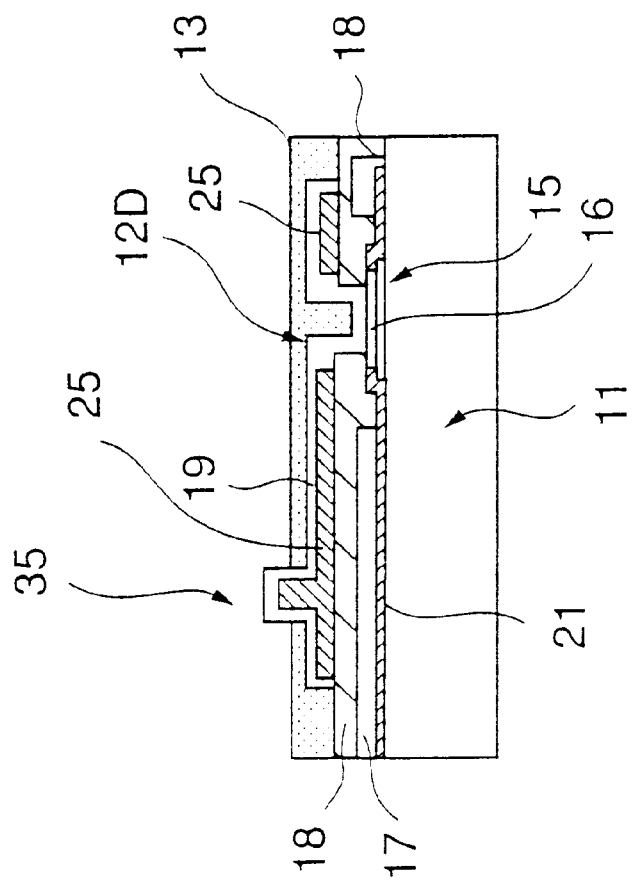
FIG. 8 is a magnified cross-sectional view of a main part of a semiconductor device according to a fourth embodiment of the present invention.

FIG. 8 is a magnified cross-sectional view of a main part of a semiconductor device 10C according to the fourth embodiment of the present invention. FIG. 9A to FIG. 9F are illustrations for explaining a manufacturing method of the semiconductor device 10C. It is noted that elements in FIG. 8 and FIG. 9A to FIG. 9F that are identical to the elements shown in FIG. 1 to FIG. 3B are referenced by the same reference marks, and will not be described in detail. In addition, the description of the manufacturing method according to the present embodiment will also be made mainly of a wire-forming step of forming a wiring 12D.

In the above-described semiconductor devices 10A and 10B according to the first and third embodiments, the solder ball 14 as a mounting terminal is an independent structure to the wirings 12A and 12C, as shown in FIG. 1 and FIG. 6. To the contrary, the semiconductor device 10C according to the present embodiment is characterized in that a mounting terminal 35 is formed as a unitary part of the wiring 12D.

Next, a description will be given, with reference to FIG. 9A to FIG. 9F, of the manufacturing method of the semiconductor device 10C according to the fourth embodiment of the present invention.

It is noted here that, since the manufacturing method according to the present embodiment is also characterized especially by a wire-forming step of forming the wiring 12D, and other manufacturing steps are well known, the following description will be made mainly of the wire-forming step of forming the wiring 12D.

In the manufacturing method according to the present embodiment, the passivation film 17 is formed on the wafer 40, subsequently the adhesive 18 is applied over the passivation film 17, and then the copper film 25 is applied on the adhesive 18, as in the manufacturing methods according to the first and second embodiments described with reference to FIG. 2A to FIG. 2F and FIG. 5A to FIG. 5F. In the present embodiment, the copper foil 25 is selected to have a thickness W larger than the thickness of the copper foil 25 according to the foregoing embodiments. Specifically, the thickness W of the copper foil 25 according to the present embodiment is equal to or greater than 50 μm (W>=50 μm).

Figure 9A:
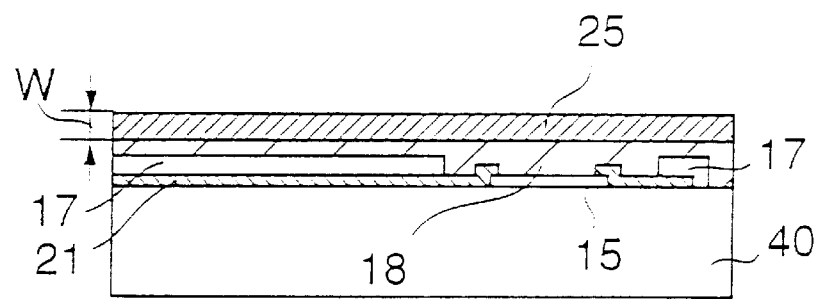
FIG. 9A is a first illustration for explaining a manufacturing method of the semiconductor device according to the fourth embodiment of the present invention.

At this point, a thickness of the copper foil 25 can be arbitrarily selected as mentioned in the foregoing embodiments, even the copper foil 25 having the large thickness can be easily applied on the wafer 40 in a short time. FIG. 9A shows the wafer 40 having the copper foil 25 having the large thickness applied thereon.

Figure 9B:
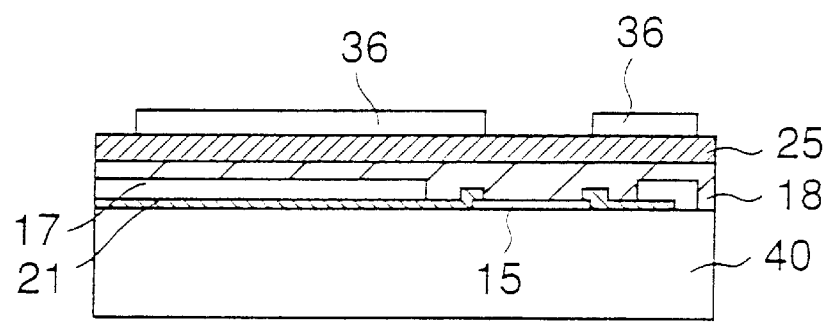
FIG. 9B is a second illustration for explaining the manufacturing method of the semiconductor device according to the fourth embodiment of the present invention.
Figure 9C:
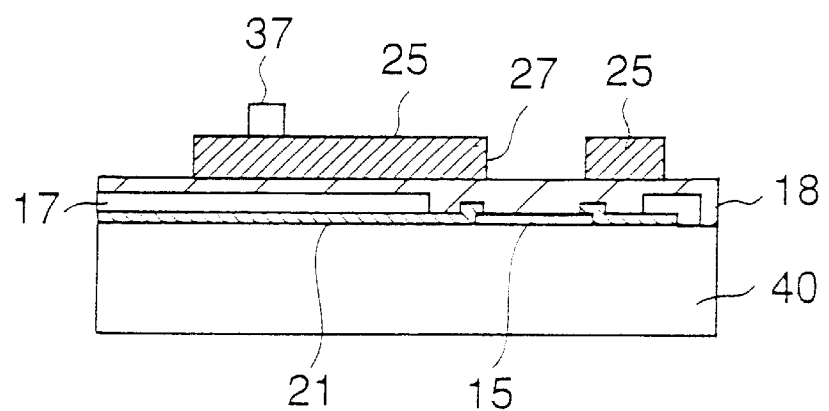
FIG. 9C is a third illustration for explaining the manufacturing method of the semiconductor device according to the fourth embodiment of the present invention.

Thereafter, as shown in FIG. 9B, a resist 36 is provided on the copper foil 25. The resist 36 is shaped according to a predetermined shape of the wiring 12D to be formed. Then, the copper foil 25 is patterned by etching, using the resist 36 as a mask. Thereby, the copper foil 25 is formed into a shape corresponding to the predetermined shape of the wiring 12D, as shown in FIG. 9C. In this process, the opening pattern 27 is formed at a position of the copper foil 25 opposing the electrode pad 15.

Figure 9D:
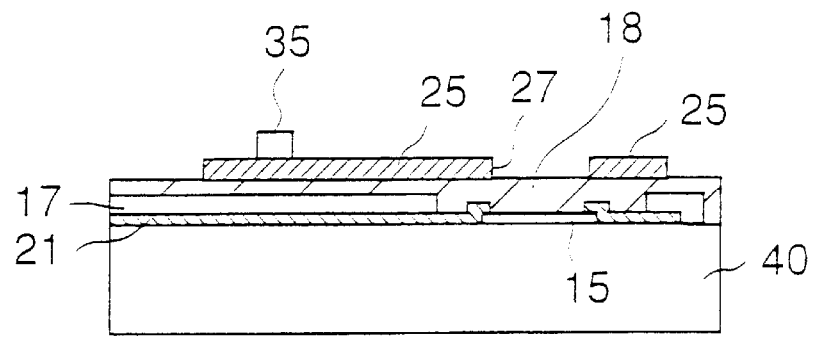
FIG. 9D is a fourth illustration for explaining the manufacturing method of the semiconductor device according to the fourth embodiment of the present invention.

Thereafter, as shown in FIG. 9C, a resist 37 is formed at a position on the copper foil 25 corresponding to a position at which the mounting terminal 35 is to be formed. Then, a half-etching is conducted to the copper foil 25 by using the resist 37 as a mask. By this half-etching process, the protruding mounting terminal 35 is formed on the copper foil 25, as shown in FIG. 9D. Thus, the mounting terminal 35 is a unitary part of the copper foil 25.

Figure 9E:
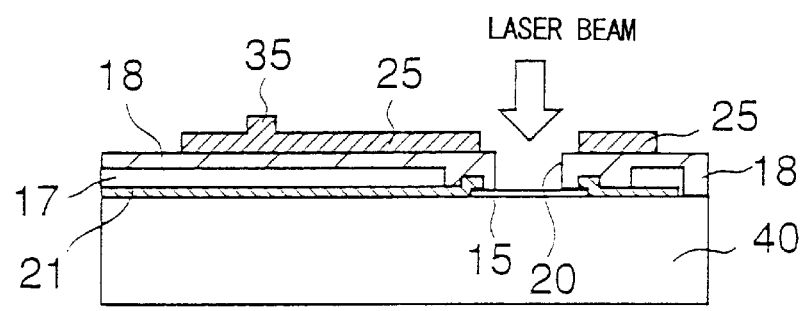
FIG. 9E is a fifth illustration for explaining the manufacturing method of the semiconductor device according to the fourth embodiment of the present invention.
Figure 9F:
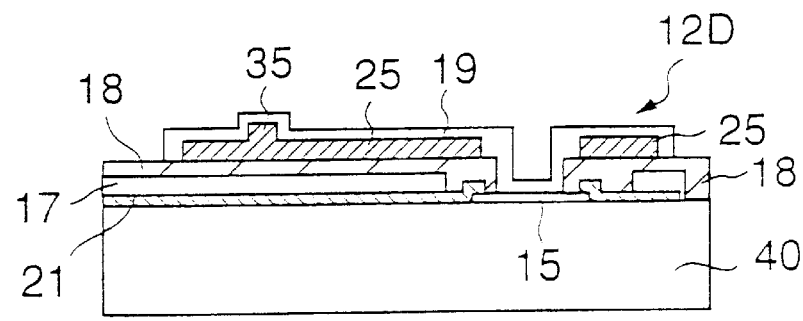
FIG. 9F is a sixth illustration for explaining the manufacturing method of the semiconductor device according to the fourth embodiment of the present invention.

After the mounting terminal 35 is formed as above, a laser beam projection is conducted by using the copper foil 25 having the opening pattern 27 as a mask. Thereby, a portion of the adhesive 18 opposing the electrode pad 15 is removed so as to form the connection hole 20. This laser beam machining exposes the electrode pad 15 outwardly thorough the connection hole 20, as shown in FIG. 9E.

After the connection hole 20 is formed in the adhesive 18, the metal film 19 is formed by using an electroless plating method, as in the first and second embodiments. Thereby, the patterned copper foil 25 is coated with the metal film 19, and the metal film 19 is surely formed on the inner wall of the connection hole 20 and on the electrode pad 15. Accordingly, the metal film 19 electrically connects the electrode pad 15 and the copper foil 25, forming the wiring 12D as shown in FIG. 7F.

As described above, since the mounting terminal 35 is unitarily formed on the copper foil 25, the present embodiment does not require a step of forming a mounting terminal independently and a step of arranging the mounting terminal on the wiring 12D. This shortens manufacturing steps of the semiconductor device 10C, and thus the semiconductor device 10C can be manufactured more efficiently.

The present invention is not limited to the specifically disclosed embodiments, and variations and modifications may be made without departing from the scope of the present invention.

The present application is based on Japanese priority application No. 2000-377684 filed on Dec. 12, 2000, the entire contents of which are hereby incorporated by reference.

What is claimed is:

1. A method of manufacturing a semiconductor device, the method comprising:
   a wire-forming step of forming a wiring on a substrate having an electrode pad so as to connect said electrode pad to a mounting terminal,
   wherein said wire-forming step includes the steps of:
      applying a metal foil to said substrate by providing an adhesive therebetween;
      patterning said metal foil into a predetermined pattern so as to form the wiring; and
      connecting said wiring to said electrode pad electrically,
      wherein said step of connecting is performed after said step of applying, and
      said step of applying includes removing a portion of said metal foil positioned above said electrode pad and a portion of said adhesive applied on said electrode pad by etching, and
      wherein a step of forming a barrier metal layer on said electrode pad is performed before said step of applying.

2. A method of manufacturing a semiconductor device, the method comprising:
   a wire-forming step of forming a wiring on a substrate having an electrode pad so as to connect said electrode pad to a mounting terminal,
   wherein said wire-forming step includes the steps of:
      applying a metal foil to said substrate by providing an adhesive therebetween;
      patterning said metal foil into a predetermined pattern so as to form the wiring; and
      connecting said wiring to said electrode pad electrically,
      wherein said step of connecting is performed after said step of applying,
      wherein said step of applying includes removing a portion of said metal foil positioned above said electrode pad and a portion of said adhesive applied on said electrode pad by a laser, and
      wherein a step of forming a barrier metal layer on said electrode pad is performed before said step of applying.

3. The method as claimed in either claim 1 or claim 2, wherein said adhesive is an elastic adhesive.

4. The method as claimed in either claim 1 or claim 2, wherein said step of connecting includes forming a metal film by electroless plating so that the metal film connects said wiring to said electrode pad electrically.

5. The method as claimed in claim 4, wherein said step of connecting includes forming the metal film by electroless plating so that the metal film connects said wiring to said electrode pad electrically, and that the metal film is formed on said metal foil patterned in said step of patterning.

6. The method as claimed in claim 5, wherein said metal foil is made of copper (Cu).

7. The method as claimed in either claim 1 or claim 2, wherein a step of forming a connection electrode on said electrode pad is performed before said step of applying so that said step of connecting includes a step of joining said metal foil to said connection electrode by heating so as to connect said metal foil and said connection electrode electrically.

8. The method as claimed in either claim 1 or claim 2, wherein a step of forming the mounting terminal on said metal foil is performed after said step of applying.

* * * * *